US006353277B1

(12) United States Patent
Hahn-Jose

(10) Patent No.: US 6,353,277 B1
(45) Date of Patent: Mar. 5, 2002

(54) ACOUSTIC TRANSDUCER

(75) Inventor: Thomas Hahn-Jose, St. Ingbert (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 09/486,191

(22) PCT Filed: Aug. 19, 1998

(86) PCT No.: PCT/EP98/05260

§ 371 Date: Jul. 7, 2000

§ 102(e) Date: Jul. 7, 2000

(87) PCT Pub. No.: WO99/10874

PCT Pub. Date: Mar. 4, 1999

(30) Foreign Application Priority Data

Aug. 23, 1997 (DE) ........................................ 197 36 808
Nov. 13, 1997 (DE) ........................................ 197 50 179

(51) Int. Cl.[7] ................................................ H01L 41/08
(52) U.S. Cl. ....................................... 310/324; 310/328
(58) Field of Search ................................ 310/324, 328, 310/357

(56) References Cited

U.S. PATENT DOCUMENTS 3,777,192 A * 12/1973 Barrow ....................... 310/324
4,037,180 A * 7/1977 De Wild ...................... 333/72
4,297,538 A * 10/1981 Massa ........................ 179/180
4,462,092 A * 7/1984 Kawabuchi et al. ........ 367/105
5,161,200 A * 11/1992 Barr ........................... 381/173
5,814,920 A * 9/1998 Takeuchi et al. ............ 310/330
6,070,468 A * 6/2000 Degertekin et al. ........... 73/644

FOREIGN PATENT DOCUMENTS

NL 8203463 A * 4/1984 ................. 310/324

* cited by examiner

*Primary Examiner*—Thomas M. Dougherty
(74) *Attorney, Agent, or Firm*—Crowell & Moring LLP

(57) ABSTRACT

An acoustic transducer, especially an air transducer, including a piezoceramic disk (10). The object of the invention is to provide an improved transducer of this type for more efficiently converting electromagnetic waves into mechanical waves and vice versa. To this end, a combination of a piezoceramic disk (10) and a membrane (8) is provided, the membrane being configured as a monomorphic flexural resonator and being composed of an epoxy-hollow glass sphere mixture or of a material which is similar in terms of its acoustic properties. The planar vibration mode (4) in the piezoceramic is converted into a thickness vibration (6) using Poisson's ratio. After the conversion, this thickness vibration is then adapted to the propagation medium, especially air, by a coupling layer having a low acoustic impedance.

17 Claims, 2 Drawing Sheets

Figure 4:
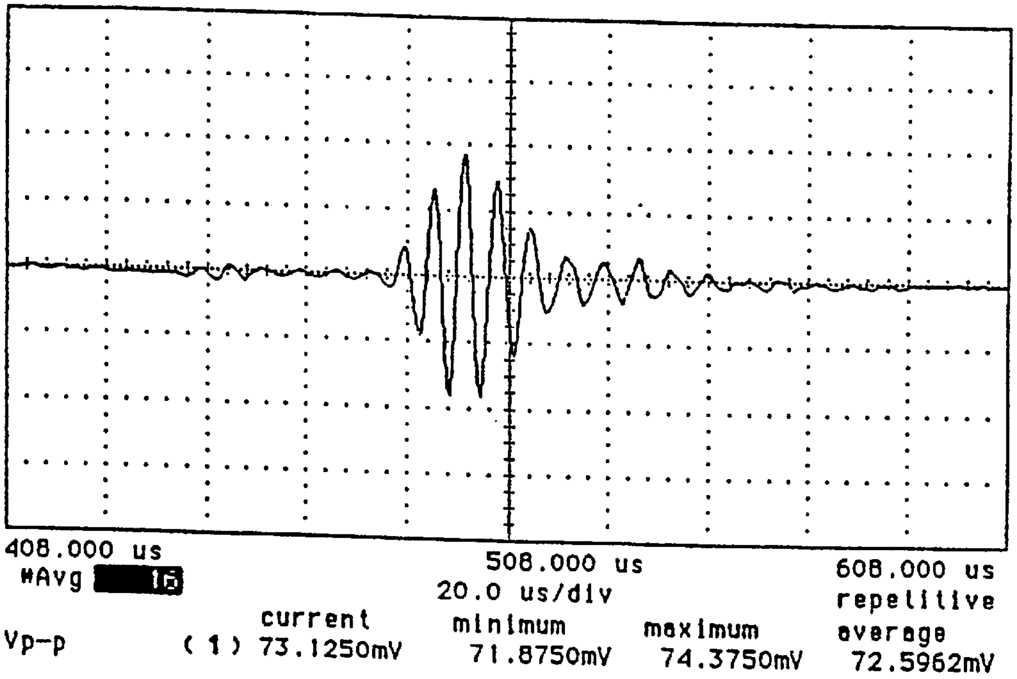

Fig. 1
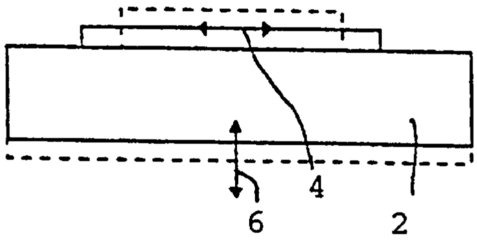
Fig. 2
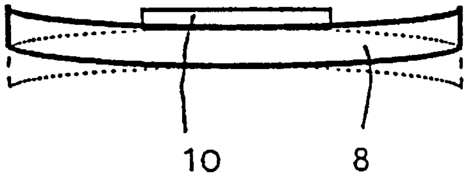
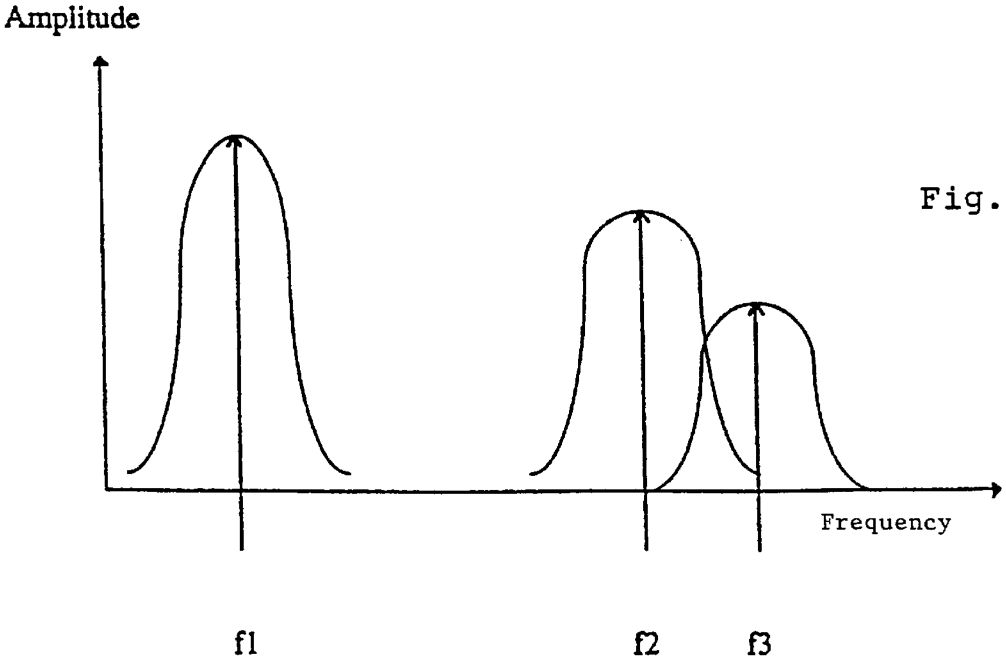
Fig. 3

ACOUSTIC TRANSDUCER

The invention relates to an acoustic transducer in accordance with the features stated in the preamble of the claim.

In the document, "Hiroshi Nishiyama et al. Piezoelectric Sound Components Used in a Broad Range of Applications, JEE Journal of Electronic Engineering, Aug. 1, 1988, pages 62–66, XP000570731," such an electroacoustic transducer is disclosed, which is configured as a monomorphous flexural vibrator. Also, in the document, "Yukata Ichinose Optimum Design of a piezoelectric diaphragm for telephone transducers, Journal of the Acoustical Society of America, Vol. 91, No. 1, Jan. 1, 1992, pages 1246–1252, xp000231994," a modeling of such a flexural vibrator is disclosed. Lastly, a flexural vibrator with a pot-like housing is disclosed in U.S. Pat. No. 5,636,182.

Electroacoustic transducers, especially air electroacoustic transducers, serve to convert electromagnetic waves to mechanical waves or vice versa. On the surface of the electroacoustic transducer or ultrasound transducers the greatest possible particle movement and fast rise times are sought after. Ultrasonic technology is based on electroacoustical waves, i.e., mechanical waves, and a wave of this kind builds up from vibrations of the individual particles in the medium in which it is propagated. In fluids, i.e., gases and liquids, no transverse waves occur, so that only the longitudinal or compression waves are of interest. The intensity of a wave of this kind follows the formula:

$$I=0.5\times Z\omega_2\xi$$

In this formula, Z represents the electroacoustic impedance of the propagation medium (product of density and sound velocity), ω the particle frequency, and ξ the particle deflection. Furthermore, for compression waves there is the relationship:

$$Z=p/c$$

with the electroacoustic impedance Z, the sound velocity C and the sound pressure p. Starting out from air as the propagation medium (Z=0.430MRayl) it is apparent that the amplitude of the particle deflection in comparison to its force determines intensity.

Different principles are known for the conversion of electrical energy to mechanical under the marginal condition of sound radiation in gases. Thus, a thickness vibrator consists of a piezoelectric ceramic in the form of a cylinder or a disk. It vibrates piston-like in its thickness, the thickness determining the resonance frequency as a geometrical factor. By varying the diameter it is possible to influence the spatial distribution of the forwardly emitted sound field.

Often these vibrators are provided on the front side with acoustically optimized λ/4 coatings or damped on the reverse side with suitable materials in order to achieve a better transfer ratio. A chief advantage in this technique is the high transmission bandwidth that can be achieved (mechanical quality×10). A problem is the thickness of the piezoceramic that is necessary at low frequencies which call for a high electrical source and load resistance.

Furthermore, flexural vibrators are known which are distinguished by a sandwich structure, and a distinction is made between a monomorphous flexural vibrator and a bimorphous flexural vibrator. The monomorphous flexural vibrator consists of a diaphragm (usually metal) onto which the piezoceramic is applied. The ceramic is smaller than the diaphragm diameter. Since the ceramic is operated in a planar resonance, its radius influences the resonance frequency. Thus the thickness of the ceramic can be very small, and the electrical source resistance can be low. The resonance frequency is determined by the geometry of the individual components and their adhesion to one another. The transducers are very inexpensive, very efficient and small, but they have an extremely narrow band (relative 6 dB P/E bandwidth×3%). In the case of the additional damping of such vibrators the efficiency decreases extremely. On the other hand the bimorphous flexural vibrators are hard to operate at frequencies above 80 kHz and are relatively expensive.

Lastly, electrostatically operated transducers are known in which the deflection of a diaphragm is produced by electrostatic forces. Such transducers react very sensitively to variations in the ambient parameters, such as temperature and humidity, and are relatively expensive.

With the standard techniques explained, on the one hand very narrow-band and effective air electroacoustical transducers can be created, and on the other hand wide-band but quite insensitive air electroacoustical transducers can be made.

Setting out from this knowledge, the invention is addressed to the problem of proposing an electroacoustic transducer, especially an air electroacoustic transducer, with which an improved, efficient conversion of electromagnetic waves to mechanical waves, or vice versa, can be achieved. The electroacoustic transducer is to combine simple construction with high reliability of operation, and is to require low manufacturing costs. A wide-band air electroacoustic transducer is to be created which has improved sensitivity.

The solution of this problem is achieved in accordance with the characteristics stated in claim 1.

The electroacoustic transducer according to the invention combines in an especially advantageous manner two vibrator principles. A composite of a piezoceramic disk and a diaphragm, preferably made of a mixture of epoxy and hollow glass spheres or an acoustically comparable material which forms a monomorphous flexural vibrator, is provided. The diaphragm is preferably part of a transducer housing. Furthermore, the planar vibration mode in the piezoceramic is converted by means of the cross-contraction ratio to a thickness vibration which, after transformation by a coupling coating layer, which has a low acoustical impedance, is matched to the propagation medium, preferably air. Further refinements and special embodiments of the invention are given in the dependent claims as well as in the description that follows.

The invention is further explained hereinafter with reference to the drawings, wherein:

FIG. 1 shows schematically the conversion of radial vibration to a thickness vibration, FIG. 2 a schematic representation of a flexural vibration, FIG. 3 a representation of the coupling of the resonances, FIG. 4 a diagram of an echo signal, by way of example.

In FIG. 1 there is shown schematically a side view of a thickness vibrator with a piezoceramic 2 which has two parts of different diameters and thicknesses, wherein the planar vibration mode of the piezo ceramic 2 is converted by the cross-contraction ratio according to arrows 4 to a thickness vibration.

FIG. 2 shows schematically a diaphragm 8 with a superimposed piezoceramic disk 10, which also is referred to hereinafter as a piezoceramic.

FIG. 3 serves to explain that the desired transfer bandwidth is achieved in particular by the fact that the center frequency of the described resonance frequencies f2 and f3 are shifted against one another. In this manner a critical coupling of the resonances is forced in an especially useful manner. In the present case the thickness resonance f2 of the thickness vibration of the piezoceramic is placed below the flexural vibration f3 of the diaphragm. The diaphragm is composed in particular of an epoxy/hollow glass sphere mixture or an acoustically comparable material. By this spectrum which is shifted toward higher frequencies and is asymmetrical with respect to the total useful frequency, a rapid transient oscillation of the transducer is achieved according to the invention. The diaphragm center frequency f3 is greater by a given factor than the center frequency f2 of the thickness vibration of the piezoceramic. This factor is especially in the range between 1.05 to 1.30, preferably between 1.0 to 2.0.

EXAMPLE EMBODIMENT

The useful resonances are obtained especially as follows:

The resonance with the center frequency f2 is produced by the thickness vibration of the piezoceramic. It can amount, for example, to 143 kHz.

The resonance of the center frequency f3 of the diaphragm is determined by the monomorphous flexural vibration. It can amount, for example, to 160 kHz.

The resonance with the center frequency f1 is established preferably by the housing vibration. It is useful to provide a pot-shaped housing wherein the center frequency f1 is dependent upon the pot geometry, especially on the thickness and height of the housing wall. It is desirable to specify small housing dimensions, and thin walls in the housing signify higher resonance frequencies. The center frequency f1 is especially at 70 kHz.

The housing resonance is quite difficult to control and is preferably lower than the useful frequency. In order to shift it towards low frequencies, i.e., away from the useful frequency, in view of the housing wall which is made thin for reasons of space, the pot is preferably filled with a damping composition, the so-called "backing." With the backing, in addition to the shifting of the housing resonance to lower frequencies, a damping of the thickness vibration and flexural vibration is achieved, and thus also a lower quality of this resonance. In the scope of the invention, the resonance with the center frequency f1 is smaller by a given factor than the center frequency f3 of the diaphragm. This factor is especially in the range between 0.35 to 0.7, preferably in the range between 0.4 to 0.6.

Useful Arrangement

The diameter of the piezoceramic depends on the position of the thickness vibration f2. At 140 kHz 11.7 mm. The diaphragm thickness also results from the thickness resonance f2. It corresponds to the quarter wavelength of an acoustical wave passing through the diaphragm. Thus, $d=c/(4\cdot f2)$, namely with the diaphragm thickness d, that of the sound velocity c in the diaphragm, and the resonance frequency f2.

The diameter of the diaphragm is obtained from the resonance frequency f3, combined with the thickness of the piezoceramic, the established diameter of the piezoceramic, the nature of the cement between the piezoceramic and the diaphragm, the elastic material parameters of the diaphragm, and the established thickness of the diaphragm.

In this case, the resonance frequency of a diaphragm held at the edge is defined by:

$$f=at/d^2$$

namely by the resonance frequency f, the diaphragm thickness t, and the diaphragm diameter D. The proportionality factor a is dependent upon the marginal conditions described above. On account of the multiplicity of the relationships the diaphragm diameter must be determined by experiment. In this case it is practical to use the ceramic thickness as an important factor in achieving a greater diaphragm stiffness. Thus the diaphragm diameter can be, for example, 12.2 mm. The ceramic thickness is found experimentally from the above explanations. It also influences the ratio of the vibration amplitudes of the resonance frequencies f2 and f3. The diaphragm thickness can be selected at 0.7 mm in a practical embodiment. The mechanical bond between the ceramic disk and the diaphragm must be able to transfer shear forces and it is achieved within the scope of the invention by a thin, hard cement layer.

FIG. 4 shows a diagram of an echo signal of the transducer according to the invention. The optimized acoustical performance of the transducer is seen directly from the fast transient oscillation behavior according to the pulse form represented. The achievable transfer bandwidth (pulse/echo, 3 dB) is around 31%. The pulse length, namely for 10 to 90% of the energy, is approximately 2.5 periods of the center frequency.

What is claimed is:

1. An acoustic transducer comprising a composite sandwich having a piezoceramic disk and a diaphragm which form a monomorphous flexural vibrator, and a coupling layer, wherein the piezoceramic disk has a planar vibration mode which is convertible by a cross-contraction ratio to a thickness vibration mode which, after transformation by the coupling layer of low acoustic impedance, is adaptable to a propagation medium, and wherein the diaphragm has a thickness corresponding to approximately a quarter wavelength of a resonance frequency of the vibration thickness mode of the piezoceramic disk.

2. An acoustic transducer according to claim 1, wherein said transducer is an air transducer, and the propagation medium is air.

3. An acoustic transducer according to claim 1, wherein center frequencies f2 and f3 of the resonance frequencies of the thickness vibration mode of the piezoceramic disk and of a flexural vibration mode of the membrane are different.

4. An acoustic transducer according to claim 1, wherein a center frequency f3 of the diaphragm is greater than a center frequency f2 of the thickness vibration mode of the piezoceramic disk by a factor in a range from 1.0 to 2.0.

5. An acoustic transducer according to claim 4, wherein the center frequency f3 of the diaphragm is greater than the center frequency f2 of the piezoceramic disk by a factor in a range from 1.05 to 1.3.

6. An acoustic transducer according to claim 1, wherein a center frequency f1 of the resonance of a housing vibration is lower than a center frequency f2 of the thickness vibration mode of the piezoceramic by a factor in a range from 0.35 to 0.7.

7. An acoustic transducer according to claim 6, wherein the center frequency f1 of the resonance of a housing vibration is lower than the center frequency f2 of the piezoceramic by a factor in a range from 0.4 to 0.6.

8. An acoustic transducer according to claim 1, wherein the piezoceramic and the diaphragm are coupled by a thin hard adhesive layer.

9. An acoustic transducer according to claim 1, wherein the thickness resonance of the piezoceramic is applied to the total useful frequency of the transducer, and the flexural vibration f3 frequency of the diaphragm is slightly above the total useful frequency.

10. An acoustic transducer according to claim 1, wherein the diaphragm is configured as part of a transducer housing.

11. An acoustic transducer according to claim 1, wherein the center frequency f2 of the thickness vibration is about 142 kHz and the center frequency f3, which is determined by the monomorphous flexural vibration, is about 160 kHz.

12. An acoustic transducer according to claim 1, wherein the transducer has a cup-shaped housing filled with a damping material or a backing.

13. An acoustic transducer according to claim 1, wherein a transducer housing is provided containing damping material.

14. An acoustic transducer according to claim 13, wherein said damping material comprises at least one material selected from the group consisting of aluminum oxide, tungsten and polymers.

15. An acoustic transducer according to claim 1, wherein the diaphragm is composed of a mixture of epoxy and hollow glass balls.

16. An acoustic transducer comprising:

a composite sandwich of a piezoceramic disk and a diaphragm which form a monomorphous flexural vibrator, and a coupling layer of low acoustic impedance, wherein a planar vibration mode in the piezoceramic disk is convertible by way of a cross-contraction ratio to a thickness vibration mode, said thickness vibration mode being transformable by said coupling layer to adapt said thickness vibration mode to a propagation medium.

17. A method of transducing acoustic energy, comprising:

forming a monomorphous flexural vibrator from a composite sandwich of a piezoceramic disk and a diaphragm, converting a planar vibration in the piezoceramic disk to a thickness vibration by way of a cross-contraction ratio, and transforming the thickness vibration via a coupling layer of low acoustic impedance to adapt the thickness vibration to a propagation medium.

* * * * *